(12) United States Patent
Lee et al.

(10) Patent No.: US 8,107,290 B2
(45) Date of Patent: Jan. 31, 2012

(54) MEMORY CELL STRUCTURE, A MEMORY DEVICE EMPLOYING SUCH A MEMORY CELL STRUCTURE, AND AN INTEGRATED CIRCUIT HAVING SUCH A MEMORY DEVICE

(75) Inventors: Yoonmyung Lee, Ann Arbor, MI (US); Michael John Wieckowski, Ann Arbor, MI (US); David Theodore Blaauw, Ann Arbor, MI (US); Dennis Michael Chen Sylvester, Ann Arbor, MI (US)

(73) Assignee: The Regents of the University of Michigan, The Ann Arbor, MI (US)

( * ) Notice: Subject to any disclaimer, the term of this patent is extended or adjusted under 35 U.S.C. 154(b) by 557 days.

(21) Appl. No.: 12/078,547

(22) Filed: Apr. 1, 2008

(65) Prior Publication Data

US 2009/0244971 A1    Oct. 1, 2009

(51) Int. Cl.
*G11C 11/34*     (2006.01)
*G11C 16/04*     (2006.01)

(52) U.S. Cl. ............ 365/185.1; 365/185.26; 365/185.15
(58) Field of Classification Search ............. 365/185.08, 365/185.26, 185.1, 185.15
See application file for complete search history.

(56) References Cited

U.S. PATENT DOCUMENTS

| | | | |
|---|---|---|---|
| 4,314,265 A * | 2/1982 | Simko ........................ | 365/185.1 |
| 4,630,238 A * | 12/1986 | Arakawa .................... | 365/185.1 |
| 5,029,132 A * | 7/1991 | Arakawa .................. | 365/185.08 |
| 5,745,416 A | 4/1998 | Shibata et al. | |
| 6,362,012 B1 * | 3/2002 | Chi et al. ......................... | 438/3 |
| 6,788,574 B1 | 9/2004 | Han et al. | |
| 6,992,938 B1 * | 1/2006 | Shubat et al. ................. | 365/201 |

FOREIGN PATENT DOCUMENTS

| | | |
|---|---|---|
| EP | 0 083 386 | 7/1983 |
| EP | 0 481 532 | 4/1992 |
| EP | 481532 A2 * | 4/1992 |
| JP | 2005005569 A * | 1/2005 |

OTHER PUBLICATIONS

Raszka et al., Embedded Flash Memory for Security Applications in a 0.13μm CMOS Logic Process, IEEE International Solid-State Circuits Conference (2004), 10 pgs.
UK Search Report dated Jul. 6, 2009 for GB 0904579.0.

* cited by examiner

*Primary Examiner* — Tuan T Nguyen
*Assistant Examiner* — Lance Reidlinger
(74) *Attorney, Agent, or Firm* — Nixon & Vanderhye P.C.

(57) ABSTRACT

A memory cell structure for a memory device includes a read transistor having a floating gate node, a tunnelling capacitor, and a coupling capacitor stack. The tunnelling capacitor is connected to the floating gate node and has a first programming terminal, and the coupling capacitor stack is connected to the floating gate node and has a second programming terminal. The coupling capacitor stack includes at least two coupling capacitors arranged in series between the floating gate node and the second programming terminal, with the coupling capacitor stack having a larger capacitance than the tunnelling capacitor. Such a memory cell structure is efficient in terms of area, and can be manufactured using standard CMOS logic manufacturing processes, thereby avoiding some of the complexities involved in the production of conventional EEPROM and Flash memory devices.

11 Claims, 10 Drawing Sheets

MEMORY CELL STRUCTURE, A MEMORY DEVICE EMPLOYING SUCH A MEMORY CELL STRUCTURE, AND AN INTEGRATED CIRCUIT HAVING SUCH A MEMORY DEVICE

TECHNICAL FIELD

The technology described in this application relates to a memory cell structure, a memory device employing such a memory cell structure, and an integrated circuit having such a memory device.

BACKGROUND

Many data processing systems require embedded non-volatile memory for storing data for access by other logic components of the data processing system. For example, an integrated circuit may include one or more processing circuits for performing data processing operations, with those data processing circuits being coupled to embedded non-volatile memory for storing data used by those data processing circuits.

However, conventional embedded non-volatile memories such as EEPROM and Flash are expensive, requiring additional mask and process steps during manufacture when compared with the standard complementary metal oxide semiconductor (CMOS) logic process that would be required to produce the other logic components of the integrated circuit. Accordingly, it is necessary to either employ such additional mask and process steps for the entire die of the integrated circuit, or instead to provide the EEPROM or Flash memory off-chip.

However, the article "Embedded Flash Memory for Security Applications in a 0.13 μm CMOS Logic Process", by J Raszka et al, IEEE International Solid-State Circuits Conference, 2004, describes a non-volatile embedded Flash memory that can be manufactured using a standard CMOS logic process with no special masks or additional process steps. Each of the memory cells of such a Flash memory require a larger area than the conventional Flash memories, and hence will typically be suitable for use in integrated circuits requiring moderate (rather than large) amounts of non-volatile memory. In such embodiments, the fact that the embedded Flash memory can be manufactured using standard CMOS logic processes is highly beneficial, since it will significantly reduce the complexity, and hence the cost, of manufacture.

FIG. 1 schematically illustrates a cross section of a memory cell structure described in the above article. FIG. 2 provides a simplified illustration of the memory cell structure of FIG. 1. As is apparent from FIGS. 1 and 2, this CMOS non-volatile memory cell structure has a floating gate node (FG) 140 where charge is stored, a coupling capacitor 100, a tunnelling capacitor 130, and a PMOS read transistor 120. Both capacitors are made with thick oxide MOS to minimise the leakage throughout the lifetime of the device, and the coupling capacitor 100 is made to have a capacitance approximately ten to twenty times larger than that of the tunnelling capacitor 130, for reasons that will become apparent from discussion of the programming process below. The read transistor 120 is also made as a thick oxide device.

To program the memory cell structure, a relatively high voltage difference of the order of 7 to 8 volts is established between programming terminal B 160 of the tunnelling capacitor 130 and programming terminal T 150 of the coupling capacitor 100. Due to the capacitance difference between the coupling capacitor 100 and the tunnelling capacitor 130, most of the programming bias is applied to the tunnelling capacitor 130, resulting in charge tunnelling taking place through the gate oxide of the tunnelling capacitor 130. This process results in a charge being stored in the floating gate node 140, which is retained after the programming voltages are removed from the programming terminals 150, 160. If the voltage difference required for programming is established by placing the programming terminal 160 at a higher voltage than the programming terminal 150, then a positive charge will be established on the floating gate node 140 during the programming operation, whilst if instead a larger voltage is placed on the programming terminal 150 relative to the programming terminal 160, a negative charge will be established on the floating gate node 140.

After the programming operation has been completed, the charge stored in the floating gate node 140 can be read using the read transistor 120. In one embodiment, this is achieved by placing a potential difference across the transistor 120 between the nodes 170, 180 sufficient to cause the transistor to turn on, whereafter the current passing through the read transistor is sensed in order to detect the charge (and hence voltage) stored at the floating gate node 140.

As mentioned earlier, whilst such a memory cell structure enables the non-volatile memory to be manufactured using standard CMOS manufacturing steps, one disadvantage is that the memory cells are relatively large. A significant factor in this is that the coupling capacitor has to be made quite large in order to produce the required coupling ratio (ratio of the capacitance of the coupling capacitor 100 to the capacitance of the tunnelling capacitor 130) required to enable programming of the memory cell to proceed as outlined above.

It would accordingly be desirable to enable the manufacturing benefits of such a non-volatile memory to be achieved, but with a reduced size for the individual memory cell structures of the memory.

SUMMARY

Viewed from a first aspect, the technology described in this application provides a memory cell structure for a memory device, comprising: a read transistor having a floating gate node; a tunnelling capacitor connected to the floating gate node and having a first programming terminal; a coupling capacitor stack connected to the floating gate node and having a second programming terminal, the coupling capacitor stack comprising at least two coupling capacitors arranged in series between the floating gate node and the second programming terminal, the coupling capacitor stack having a larger capacitance than the tunnelling capacitor; during a programming operation, a voltage difference being established between the first programming terminal and the second programming terminal to cause charge tunnelling to occur through the tunnelling capacitor, such that after the programming operation a charge is stored in the floating gate node; and during a read operation the read transistor being activated to produce an output signal indicative of the charge stored in the floating gate node.

A stacked structure is employed for the coupling capacitor. In particular, a coupling capacitor stack is formed of at least two coupling capacitors arranged in series between the floating gate node and a second programming terminal. The coupling capacitor stack has a larger capacitance than the tunnelling capacitor so as to provide a suitable coupling ratio to enable programming of the memory cell structure to take place. The inventors realised that by adopting such a structure for the coupling capacitor within the memory cell structure, it was possible to significantly reduce the size of the memory cell structure, for reasons that will be discussed in more detail below.

In the prior art non-volatile memory cell structure as described earlier with reference to FIGS. 1 and 2, following the programming operation, the coupling capacitor 100 becomes the main leakage path for the charge stored at the floating gate node 140, this being due to the relatively large area of the coupling capacitor 100 when compared with the tunnelling capacitor 130. By replacing the coupling capacitor 100 with a coupling capacitor stack, where at least two coupling capacitors are arranged in series between the floating gate node and the second programming terminal, the voltage drop across each capacitor in the stack is less than that occurring across the prior art coupling capacitor 100. Since leakage current rises exponentially with the voltage drop across such a capacitor, then this drop in voltage across each individual capacitor gives rise to a significant drop in leakage current. Having realised that by using a coupling capacitor stack, a significant drop in leakage current could be observed, the inventors then further realised that there was no longer a need for so much charge to be stored in the floating gate node, since whatever charge is placed there during the programming operation will be discharged less quickly, and accordingly the read transistor would still be able to correctly sense the stored state for just as long as the prior art device of FIGS. 1 and 2, but with less initial charge following the programming operation.

Having realised that there would no longer be a need to place so much charge into the floating gate node 140 during the programming operation, the inventors then realised that there would no longer be a need for such a large coupling ratio, i.e. the capacitance of the coupling capacitor stack would not need to be as large as the capacitance of the prior art coupling capacitor 100. To replace a single capacitor with a stacked arrangement, it would typically be necessary for the individual capacitors in the stack to have a larger capacitance than the single capacitor being replaced (since larger capacitors in series are needed to achieve the same capacitance in total as the single capacitor being replaced). However, given the above realisation that the coupling ratio, and hence the overall capacitance of the coupling capacitor stack, could be reduced, the inventors realised that it would be possible in many instances for the coupling capacitor stack to be constructed so that it takes up less area than the prior art coupling capacitor 100, thereby reducing the overall size of the memory cell structure.

Accordingly, through use of the coupling capacitor stack, a memory cell structure can be provided which has less area than the memory cell structure of the prior art of FIG. 1 or 2, whilst retaining the manufacturing benefits of such non-volatile memory cell structures.

It should also be noticed that in addition to, or instead of, reducing area, the memory cell structure could be used to increase the lifetime of the memory device when compared with a memory device constructed using the prior art memory cell structure of FIG. 1 or 2. This is due to the fact that the lifetime of a non-volatile memory cell is increased by reducing the floating gate leakage. Since the device produces less leakage, this can be used to extend the lifetime of the memory cell. There will, however, typically be a trade off between lifetime and capacitor size, since a smaller cell size means a smaller coupling ratio, which in turn means less charge accumulated during programming and hence less lifetime. However, by careful control of the capacitor size and lifetime, it will be possible in some instances to produce a memory cell design which is both smaller, and has a longer lifetime, than the known prior art memory cell.

The memory cell structure will typically be formed on a substrate, and in one embodiment each intermediate node between adjacent coupling capacitors in the coupling capacitor stack is isolated from the substrate. By isolating such intermediate nodes from the substrate, this ensures that the leakage current reduction benefits resulting from arranging the coupling capacitors in a stack are maximised, by avoiding any leakage from the intermediate node bypassing further coupling capacitors in the coupling capacitor stack.

In one embodiment, the read transistor, the tunnelling capacitor and at least a first coupling capacitor in the coupling capacitor stack are formed on the substrate. In one particular embodiment, the read transistor and any capacitors formed on the substrate are formed as metal oxide semiconductor (MOS) structures with certain portions of the devices formed by changing doping levels in associated regions of the substrate. However, such an arrangement is not a requirement, and by way of example, in one embodiment, none of the coupling capacitors need be formed on the substrate in such a manner.

The various coupling capacitors of the coupling capacitor stack can be arranged in a variety of ways. However, in one embodiment, more than one type of capacitor is used to form the coupling capacitors of the coupling capacitor stack in order to allow physical overlapping of coupling capacitors. In particular, the memory cell structure will typically be manufactured by applying multiple layers to the substrate, and by using different types of capacitors, certain capacitors in the coupling capacitor stack can be formed in different layers to other capacitors in the coupling capacitor stack, thereby allowing physical overlapping of the coupling capacitors, and enabling further size reductions to be achieved.

Whilst in principle the coupling capacitor stack may comprise more than two coupling capacitors, in one embodiment the coupling capacitor stack comprises two coupling capacitors arranged in series between the floating gate node and the second programming terminal. It has been found that such an approach enables the coupling ratio to be maintained at a high enough level to allow ready programming of the memory cell structure, whilst also giving rise to significant size reduction benefits.

In one embodiment, a first coupling capacitor in the coupling capacitor stack is formed on a substrate, and an intermediate node between the first coupling capacitor and a second coupling capacitor in the coupling capacitor stack is isolated from the substrate. As mentioned earlier, by isolating the intermediate node from the substrate, the leakage current reduction benefits resulting from the use of the coupling capacitor stack can be maximised.

The first and second coupling capacitors can be provided in a variety of ways. However, in one embodiment the second coupling capacitor is a metal-insulator-metal (MIM) capacitor. By arranging this second coupling capacitor to be a MIM capacitor, the MIM capacitor can be formed in the upper metal layers of the memory cell structure, and hence can be readily isolated from the substrate.

In some embodiments, both of the coupling capacitors in the coupling capacitor stack may be formed as MIM capacitors. However, in one embodiment the first coupling capacitor is a metal oxide semiconductor (MOS) capacitor, the MIM capacitor being formed in one or more layers above the MOS capacitor. It has been found that by providing one of the coupling capacitors as a MOS capacitor, and the other coupling capacitor as a MIM capacitor, this provides a particularly space efficient mechanism for forming the coupling capacitor stack. In particular, in one embodiment, the MIM capacitor at least partly physically overlies the MOS capacitor, thereby producing a particularly area efficient coupling capacitor stack. Hence, in such embodiments, the area savings are twofold, a first area saving resulting from the reduced coupling ratio (and hence reduced size of coupling capacitor) required when using a coupling capacitor stack, and the second space saving arising from the physical overlapping of the individual capacitors in the coupling capacitor stack.

The physical design of each coupling capacitor in the coupling capacitor stack can be varied dependent on implementation. However, in one embodiment each coupling capacitor in the coupling capacitor stack has approximately the same capacitance. By arranging each coupling capacitor in the coupling capacitor stack to have approximately the same capacitance, the voltage drop across each of the coupling capacitors is then relatively equal, thus balancing the leakage current through the various coupling capacitors of the coupling capacitor stack. However, it is possible to vary the capacitance of each individual coupling capacitor by some degree, for example to accommodate size constraints that may apply in particular layers of the device in which a particular coupling capacitor is to be provided.

Viewed from a second aspect, the technology described in this application provides a memory device comprising an array of memory cells, each memory cell comprising at least one memory cell structure, and each memory cell structure comprising: a read transistor having a floating gate node; a tunnelling capacitor connected to the floating gate node and having a first programming terminal; a coupling capacitor stack connected to the floating gate node and having a second programming terminal, the coupling capacitor stack comprising at least two coupling capacitors arranged in series between the floating gate node and the second programming terminal, the coupling capacitor stack having a larger capacitance than the tunnelling capacitor; during a programming operation, a voltage difference being established between the first programming terminal and the second programming terminal to cause charge tunnelling to occur through the tunnelling capacitor, such that after the programming operation a charge is stored in the floating gate node; and during a read operation the read transistor being activated to produce an output signal indicative of the charge stored in the floating gate node.

In one embodiment, each memory cell can be formed from a single memory cell structure. However, in an alternative embodiment, each memory cell comprises a first memory cell structure and a second memory cell structure, during the programming operation the voltage differences established between the first and second programming terminals of the first memory cell structure and the second memory cell structure being such that after the programming operation a positive charge is stored in the floating gate node of the first memory cell structure and a negative charge is stored in the floating gate node of the second memory cell structure. During the read operation, the difference between the output signals produced by the read transistors of the first and second memory cell structures indicates a data value stored in the memory cell. By pairing the memory cell structures in such a manner, and programming each memory cell structure in the pair in the opposite sense, this provides a simple mechanism for detecting the stored data value by identifying the difference in the output signals produced by the memory cell structures of the pair during the read operation.

Viewed from a third aspect, the technology described in this application provides an integrated circuit comprising: processing circuitry for performing data processing operations; and a memory device for storing data for access by the processing circuitry; the memory device comprising an array of memory cells, each memory cell comprising at least one memory cell structure, and each memory cell structure comprising: a read transistor having a floating gate node; a tunnelling capacitor connected to the floating gate node and having a first programming terminal; a coupling capacitor stack connected to the floating gate node and having a second programming terminal, the coupling capacitor stack comprising at least two coupling capacitors arranged in series between the floating gate node and the second programming terminal, the coupling capacitor stack having a larger capacitance than the tunnelling capacitor; during a programming operation, a voltage difference being established between the first programming terminal and the second programming terminal to cause charge tunnelling to occur through the tunnelling capacitor, such that after the programming operation a charge is stored in the floating gate node; and during a read operation the read transistor being activated to produce an output signal indicative of the charge stored in the floating gate node.

DESCRIPTION OF NON-LIMITING, EXAMPLE EMBODIMENTS

Figure 1:
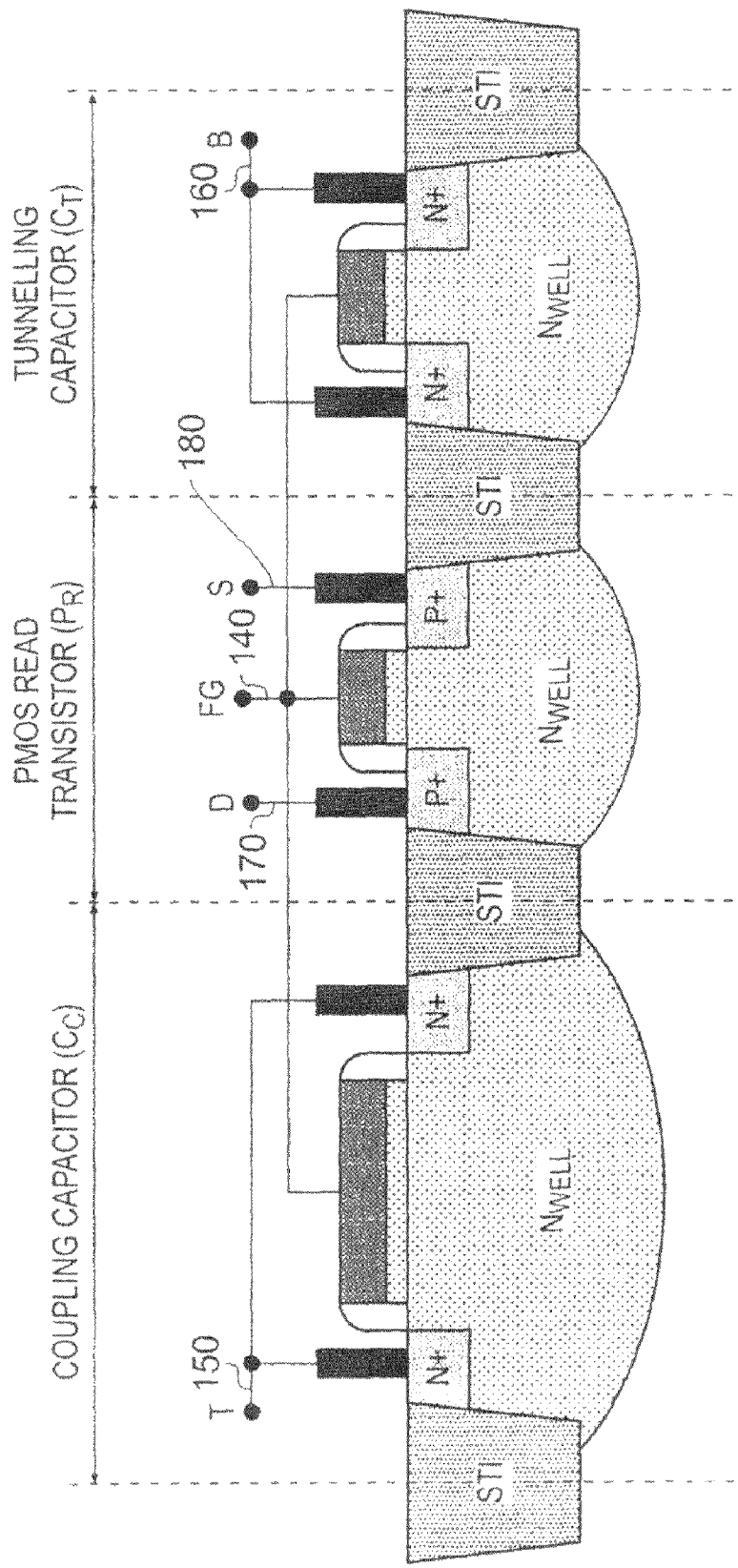
FIG. 1 is a cross-sectional view of a memory cell structure in accordance with a known prior art arrangement.
Figure 2:
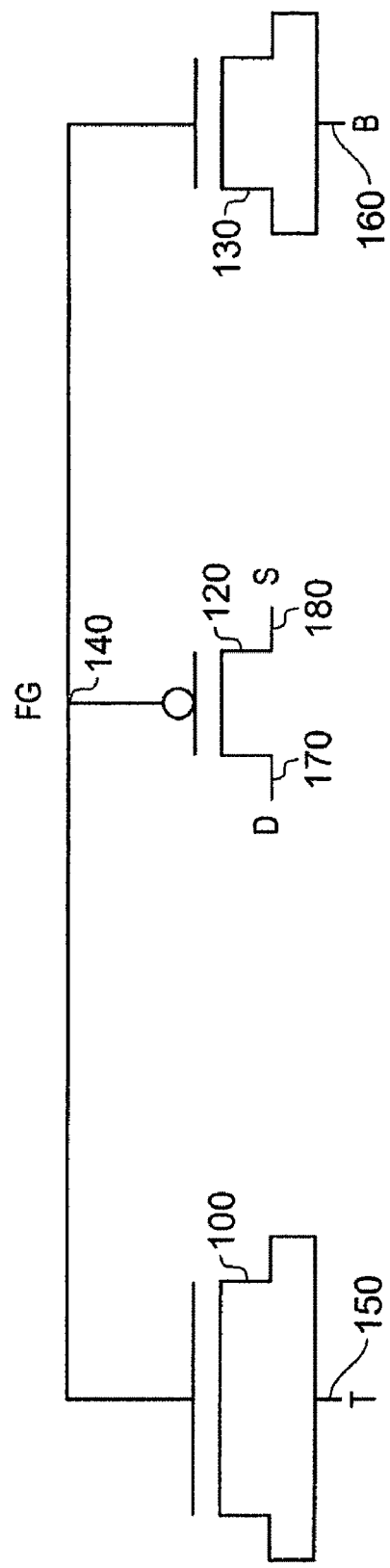
FIG. 2 schematically illustrates the memory cell structure of FIG. 1.
Figure 3:
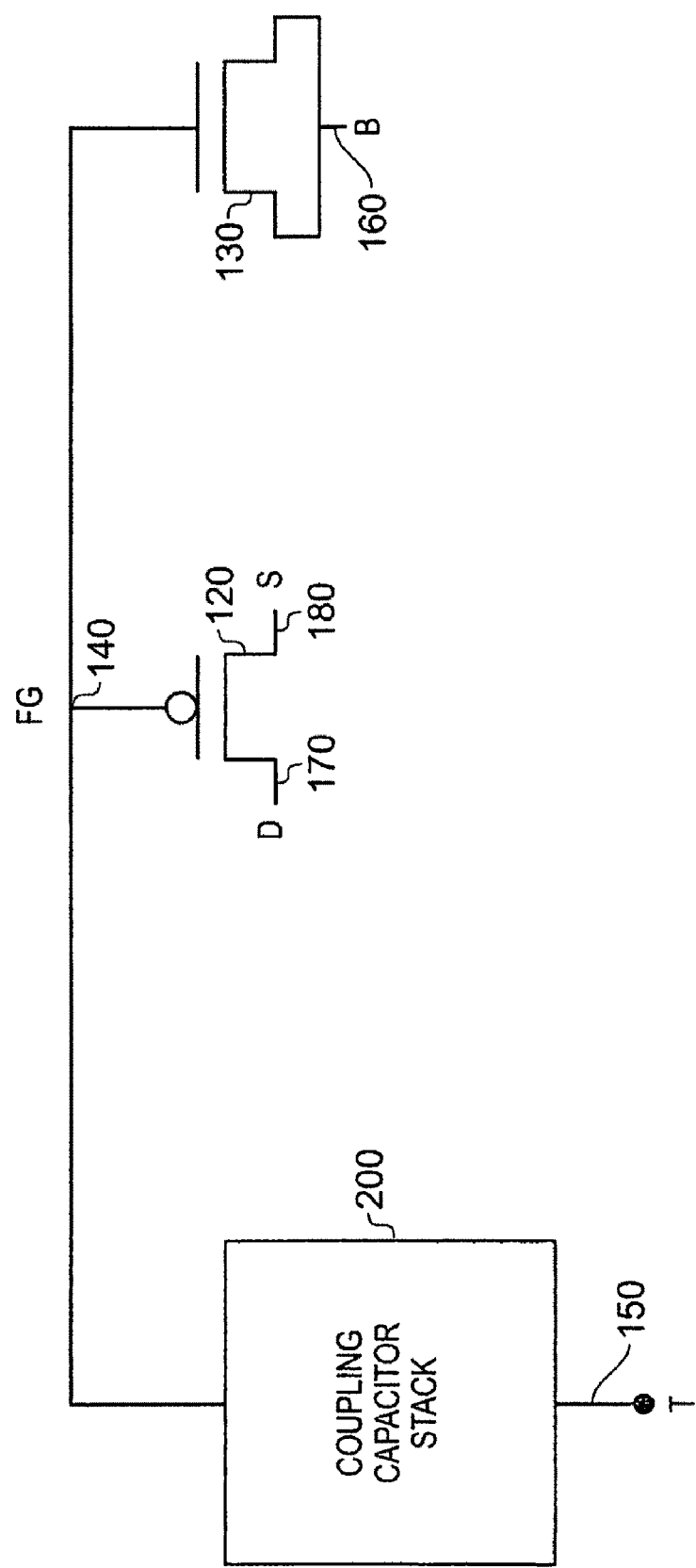
FIG. 3 schematically illustrates the memory cell structure in accordance with one non-limiting, example embodiment.

FIG. 3 schematically illustrates a memory cell structure in accordance with non-limiting example embodiments. Those components which are the same as in the prior art memory cell structure of FIG. 2 are indicated with the same reference numerals. As can be seen from a comparison of FIG. 3 with FIG. 2, the single coupling capacitor 100 of the prior art of FIG. 2 is replaced with the coupling capacitor stack 200 in non-limiting, example embodiments. As discussed earlier, by using such a coupling capacitor stack, a reduction in area of the memory cell structure, and hence the memory device incorporating such memory cell structures, can be achieved.

In particular, in the prior art device of FIG. 2, the coupling capacitor 100 gave rise to the main leakage path for the charge stored in the floating gate node 140, due to the large area of that coupling capacitor. By replacing the coupling capacitor with a coupling capacitor stack comprising at least two coupling capacitors arranged in series between the floating gate node 140 and the programming terminal 150, the voltage drop across each capacitor in the stack is reduced relative to the voltage drop occurring across the coupling capacitor 100 of the prior art.

Figure 4:
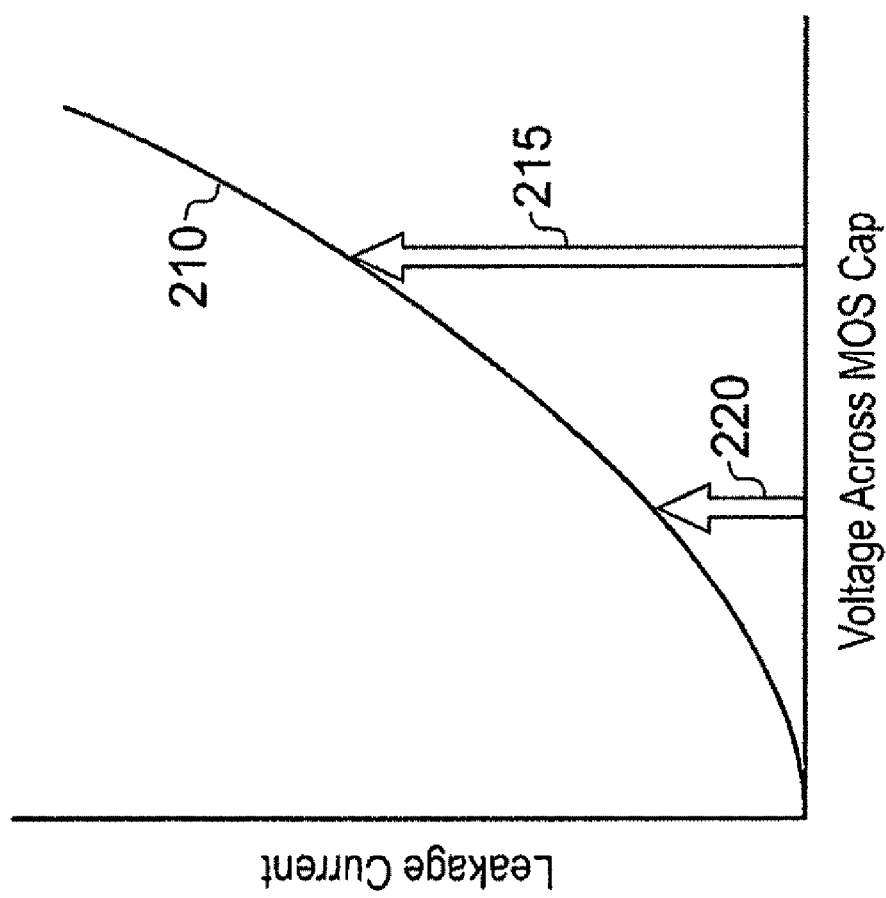
FIG. 4 is a chart illustrating the correlation between leakage current and the voltage across a capacitor.

FIG. 4 is a chart showing how leakage current varies with voltage drop across a MOS capacitor. As can be seen, the leakage current rises exponentially with such voltage drop. Assuming an example where the coupling capacitor stack 200 contains two coupling capacitors of equal capacitance, it will be appreciated that the voltage drop across each individual capacitor in the coupling capacitor stack 200 will be approximately halved compared with the voltage drop across the prior art coupling capacitor 100. Accordingly, if arrow 215 represents the voltage drop across the prior art coupling capacitor 100, and in particular points to the location on the curve 210 indicating the leakage current of that coupling capacitor, then it can be seen that the arrow 220 identifies the leakage current observed by each coupling capacitor in the coupling capacitor stack 200, assuming each capacitor has half the voltage drop of the coupling capacitor 100. As will be appreciated from FIG. 4, the reduction in leakage current is quite significant.

Figure 5:
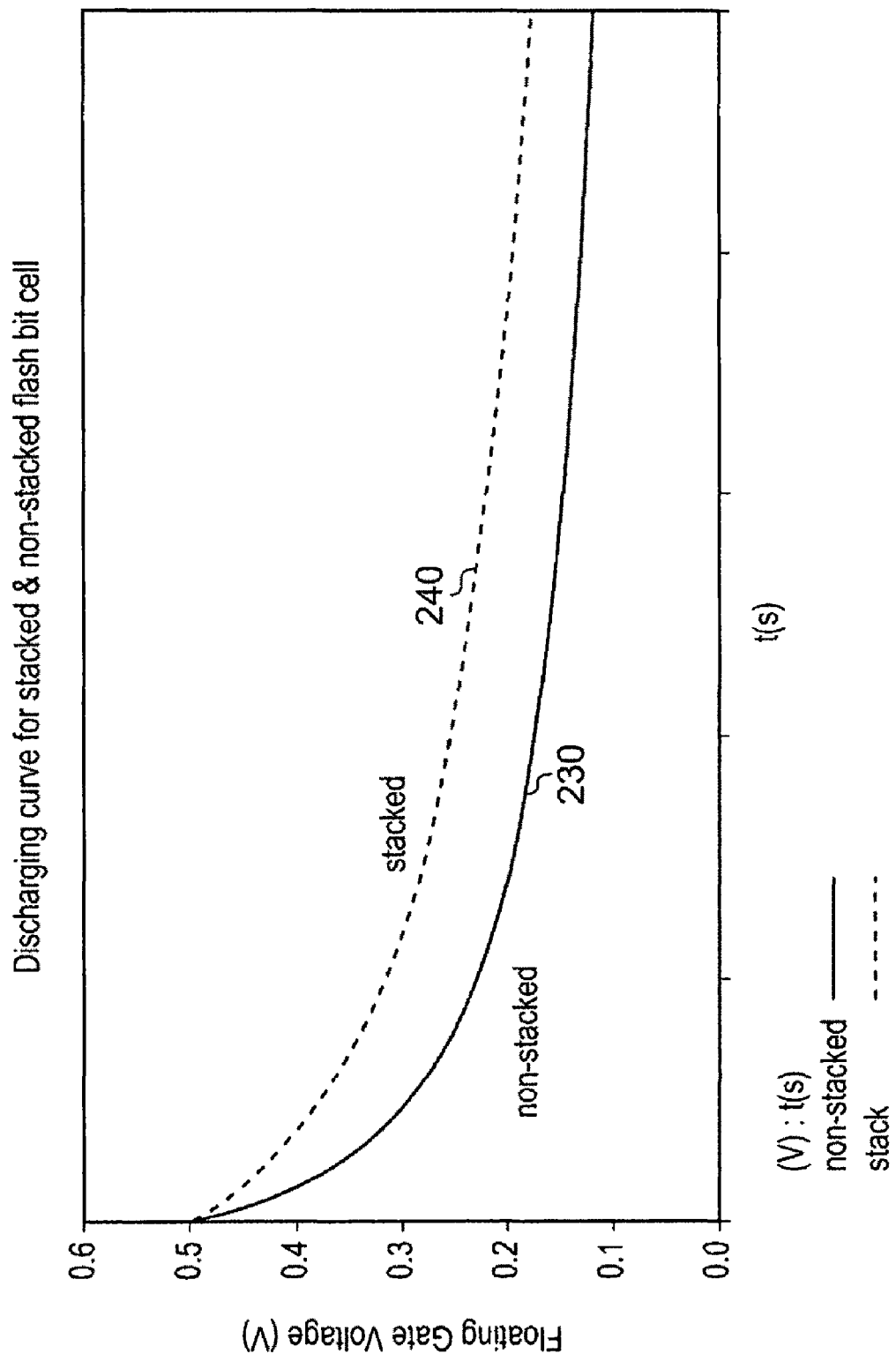
FIG. 5 is a chart illustrating the difference in discharge of the floating gate node of a memory cell structure, comparing the stacked arrangement of non-limiting, example embodiments with the prior art arrangement of FIG. 2.

The effect of this drop in leakage current can be seen from the chart of FIG. 5, which shows how the voltage at the floating gate node 140 discharges over time, firstly for a non-stacked arrangement such as the prior art of FIG. 2 (shown by the line 230 in FIG. 5), and secondly for a stacked arrangement such as shown in FIG. 3 (shown by the line 240 in FIG. 5). In both cases, it is assumed that the floating gate node 140 has a voltage of 0.5 volts after the programming operation has completed. As can be seen, using the stacked arrangement of example embodiments, the discharge in voltage is significantly less than with the non-stacked arrangement.

Considering the prior art arrangement, having regard to the maximum voltage that can be applied across the programming terminals (usually 6-8 volts), a coupling ratio is chosen such that the voltage to which the floating gate node 140 is charged during the programming operation is at a level, whereby for the duration of time the memory cell structure is expected to hold its value (which typically is measured in years), the voltage will never discharge to a level where the read transistor 120 will no longer be able to detect the stored value, or will detect an erroneous value. By way of illustration, considering the example of FIG. 5, the minimum voltage required at the floating gate node 140 for correct sensing of the stored data value may be 0.1 volts. Considering line 230 in FIG. 5, this would imply that the floating gate node 140 needs to be charged to 0.5 volts at the end of the programming operation.

However, as can be seen from the line 240 in FIG. 5, given the reduction in leakage current that results from the use of a coupling capacitor stack 200, there is no longer a requirement for the floating gate node to be programmed to a voltage level of 0.5 volts, and instead a lesser voltage can be used at the floating gate node 140. If a lesser voltage level (and hence charge) at the floating gate node 140 is used, the coupling ratio (i.e. the ratio of the capacitance of the coupling capacitor to the tunnelling capacitor) can be reduced when using a coupling capacitor stack 200. As a result, the area required for the coupling capacitor stack 200 can be reduced relative to the area required for the single coupling capacitor 100 of the prior art of FIG. 2, thereby enabling a memory cell structure produced using the coupling capacitor stack 200 of non-limiting, example embodiments to occupy less area than the known prior art memory cell structure of FIG. 2.

Figure 6:
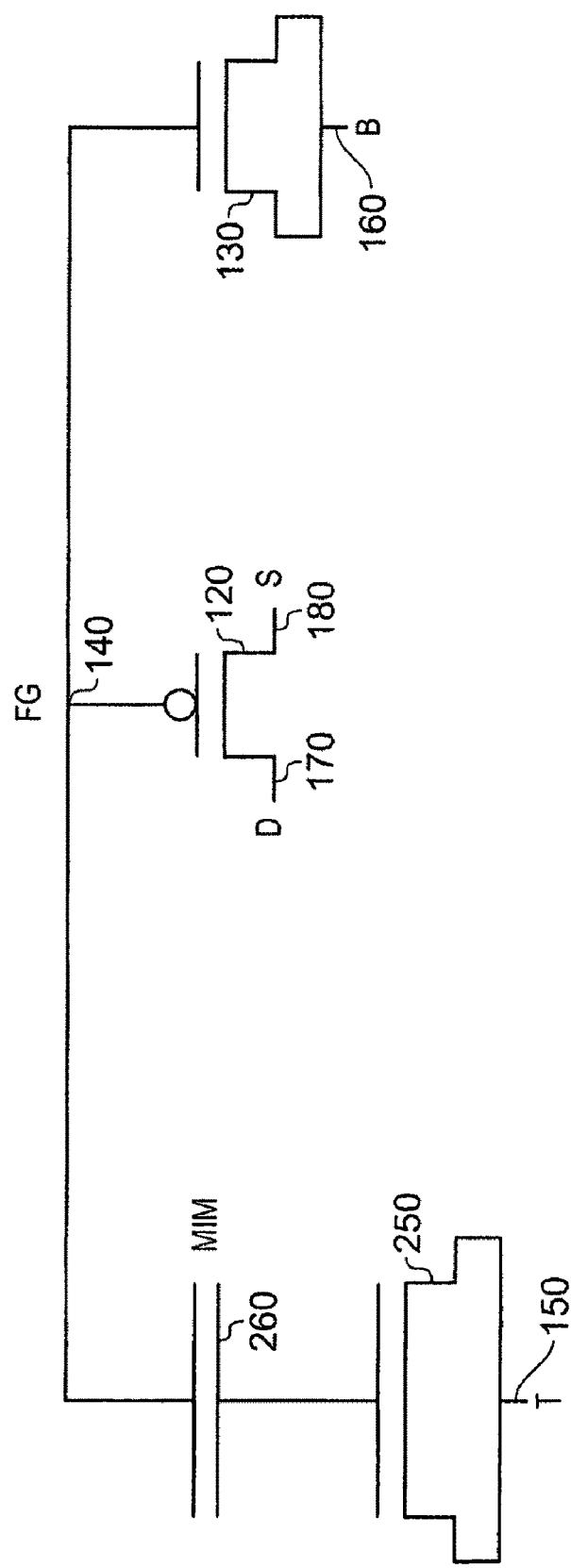
FIG. 6 schematically illustrates one particular embodiment of a memory cell structure in accordance with one non-limiting, example embodiment.
Figure 7:
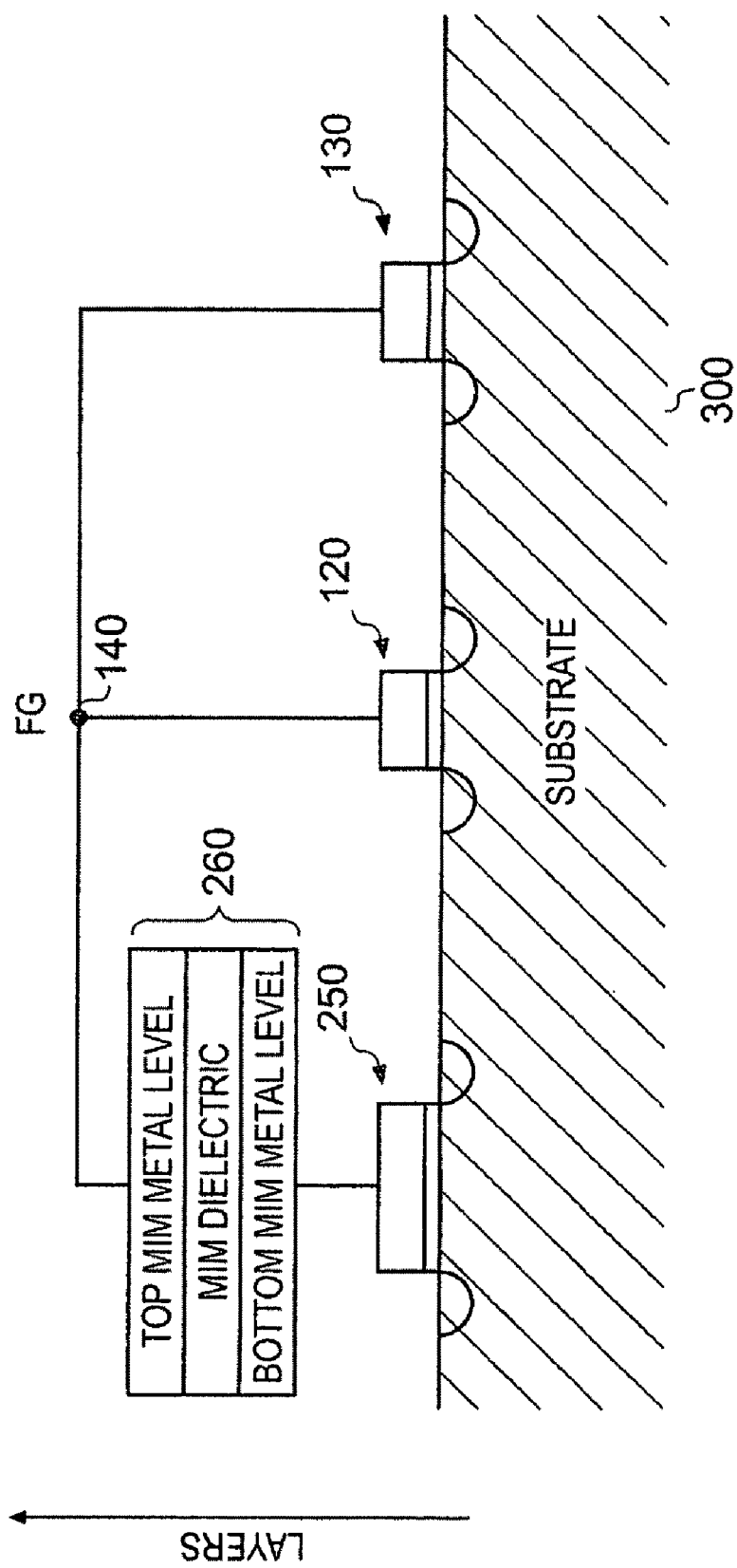
FIG. 7 illustrates how, when employing the embodiment of FIG. 6, the MIM capacitor can be arranged to overlie the MOS capacitor in the coupling capacitor stack.

For best results, the intermediate node between adjacent coupling capacitors in the coupling capacitor stack should be isolated from the substrate body of the memory cell structure. Whilst the coupling capacitors can be arranged in a variety of ways to achieve this, one arrangement which achieves such isolation is shown in FIG. 6. In this example, the coupling capacitor stack 200 is formed by a first MOS capacitor 250, connected in series with a metal-insulator-metal (MIM) capacitor 260. Since the MIM capacitor can be formed in the upper metal layers of the device, it can be readily isolated from the substrate body. This is illustrated schematically by FIG. 7. As shown in FIG. 7, the MOS capacitor 250 is formed on the substrate 300, as indeed is the PMOS read transistor 120 and the tunnelling capacitor 130 in the illustrated example embodiment. However, the MIM capacitor 260 is formed by MIM metal levels separated by a MIM dielectric, and the required MIM metal levels for the MIM capacitor can be formed in the upper layers of the device, in one particular example embodiment the MIM capacitor 260 being positioned between the fifth metal level and the sixth metal level.

In one embodiment, both of the coupling capacitors in the coupling capacitor stack could be formed by MIM capacitors. However, in the embodiment shown in FIGS. 6 and 7, one of the capacitors is formed by a MOS capacitor 250, and the other by a MIM capacitor 260, since this not only allows the isolation of the intermediate node, but also allows for some physical overlapping of the two capacitors when manufacturing the memory device. In particular, as will be appreciated from FIG. 7, the MIM capacitor 260 can at least partly overlie the MOS capacitor 250, and indeed in some embodiments will completely overlie the MOS capacitor 250 (and potentially one or more other components provided at the same level as the MOS capacitor 250). This can provide further reductions in area overhead, over and above those resulting from the reduced coupling ratio (and hence coupling capacitor size) achieved when using a coupling capacitor stack.

Figure 8:
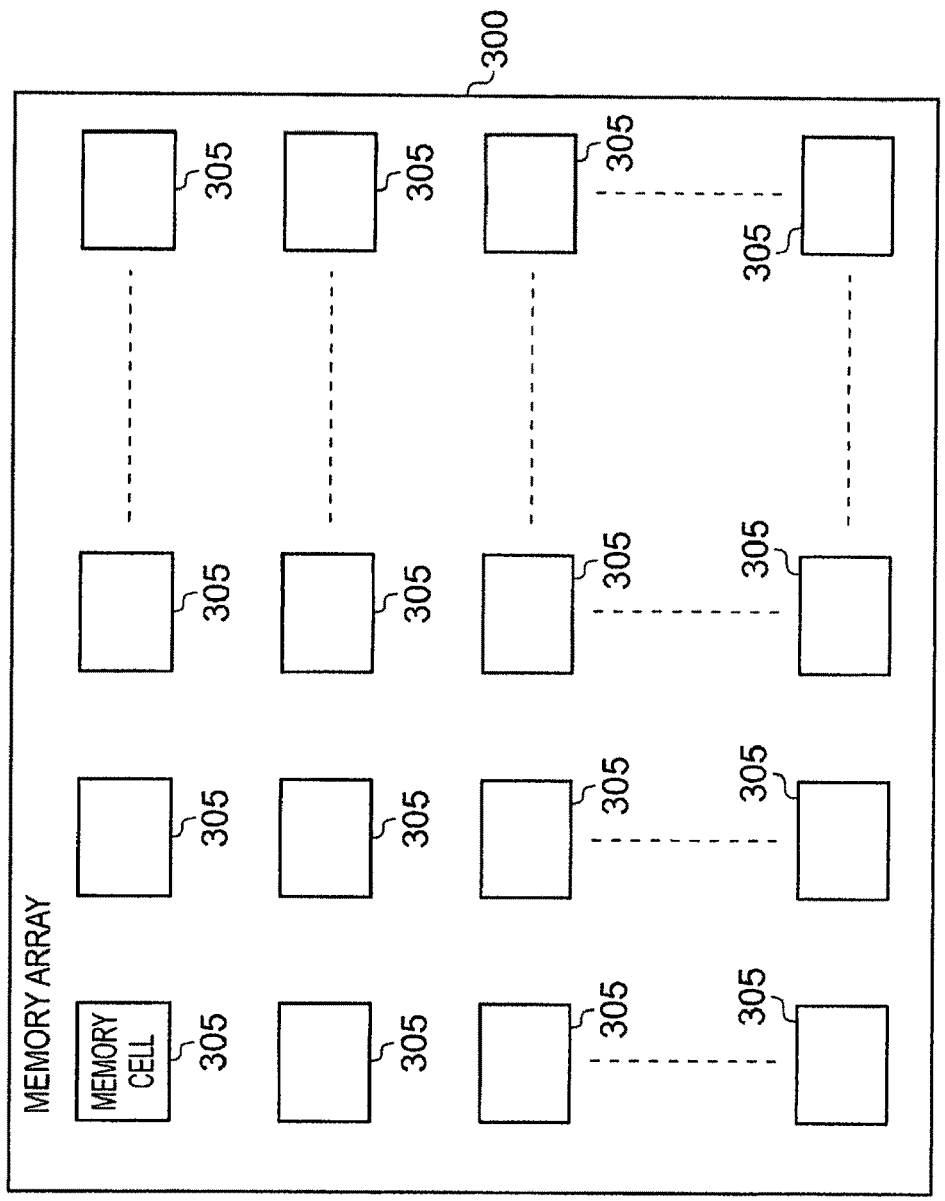
FIG. 8 schematically illustrates a memory array incorporating memory cells constructed using the memory cell structure of non-limiting, example embodiments.
Figure 9:
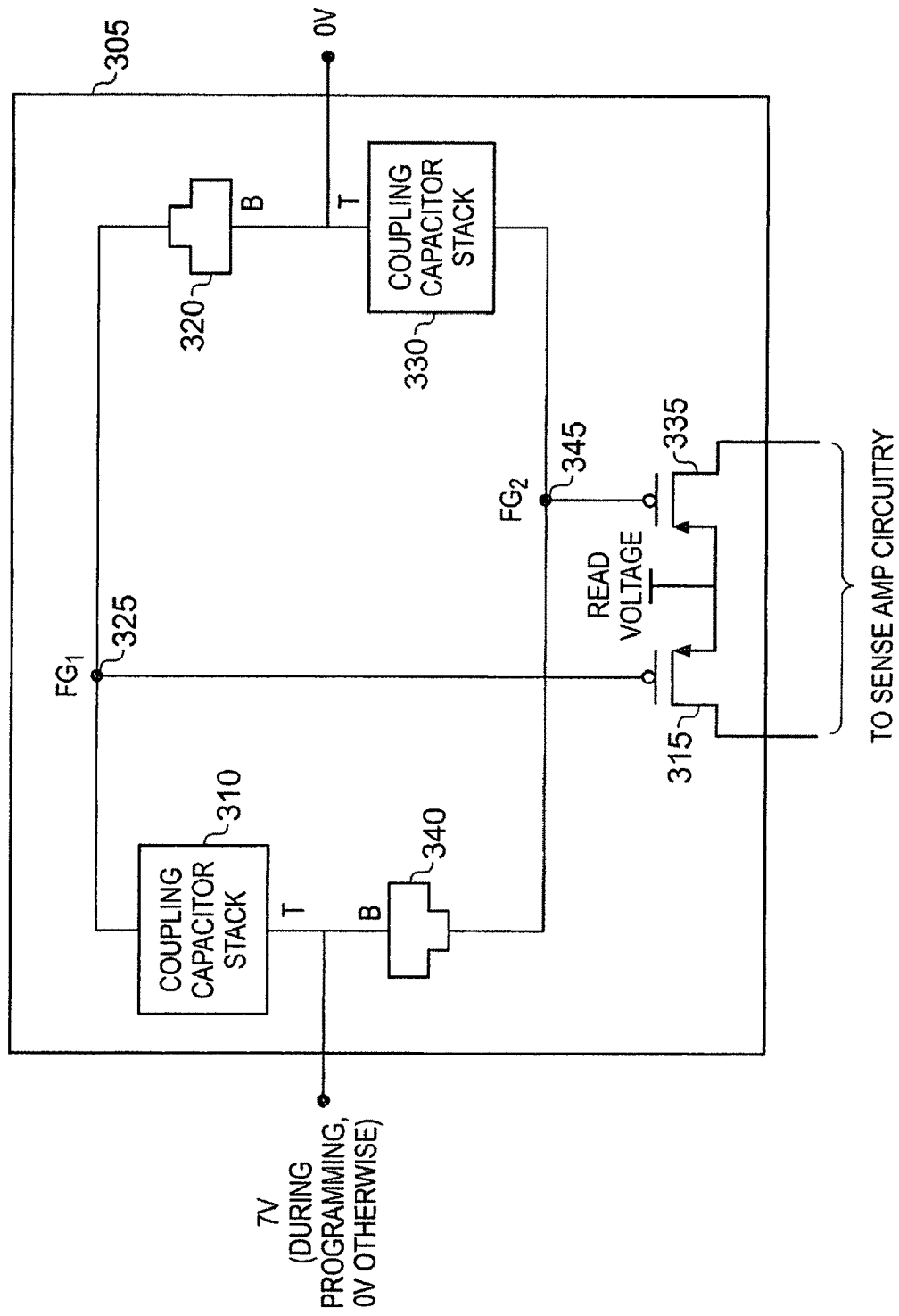
FIG. 9 illustrates one embodiment of the memory cells of FIG. 8, using a pair of memory cell structures in accordance with non-limiting, example embodiments.

A memory device will typically include a memory array 300 as illustrated in FIG. 8, the memory array having an array of memory cells 305 positioned throughout the memory array. Each memory cell can in one example embodiment be formed by the memory cell structure as shown in FIG. 3. In an alternative embodiment, a pair of such memory cell structures can be used to form each memory cell, as shown schematically in FIG. 9. In this example, a first memory cell structure consists of the coupling capacitor stack 310, the read transistor 315, and the tunnelling capacitor 320. Similarly, a second memory cell structure consists of the coupling capacitor stack 330, the read transistor 335, and the tunnelling capacitor 340. The B and T programming terminals of the first and second memory cell structures are connected to the programming potentials in the opposite sense, in this particular example shown in FIG. 9 the T terminal of the first memory cell structure being connected to +7 volts during the programming operation, whilst the B terminal is connected to 0 volts, whilst for the second memory cell structure it is the B terminal that is connected to +7 volts, with the T terminal being connected to 0 volts. As a result of this arrangement, at the end of the programming operation, the floating gate node 325 of the first memory cell structure will have a negative charge stored therein, whilst the floating gate node 345 of the second memory cell structure will have a positive charge stored therein.

Following the programming operation, when a read operation takes place, the source terminals of both read transistors 315, 335 are connected to a read voltage, and the current drawn through the drain paths of both read transistors is then monitored by sense amp circuitry in order to detect the stored data value. It will be appreciated that it is not necessary to sense the current differential between the two lines, and instead the voltage differential between the two lines could be monitored by the sense amp circuitry.

Figure 10:
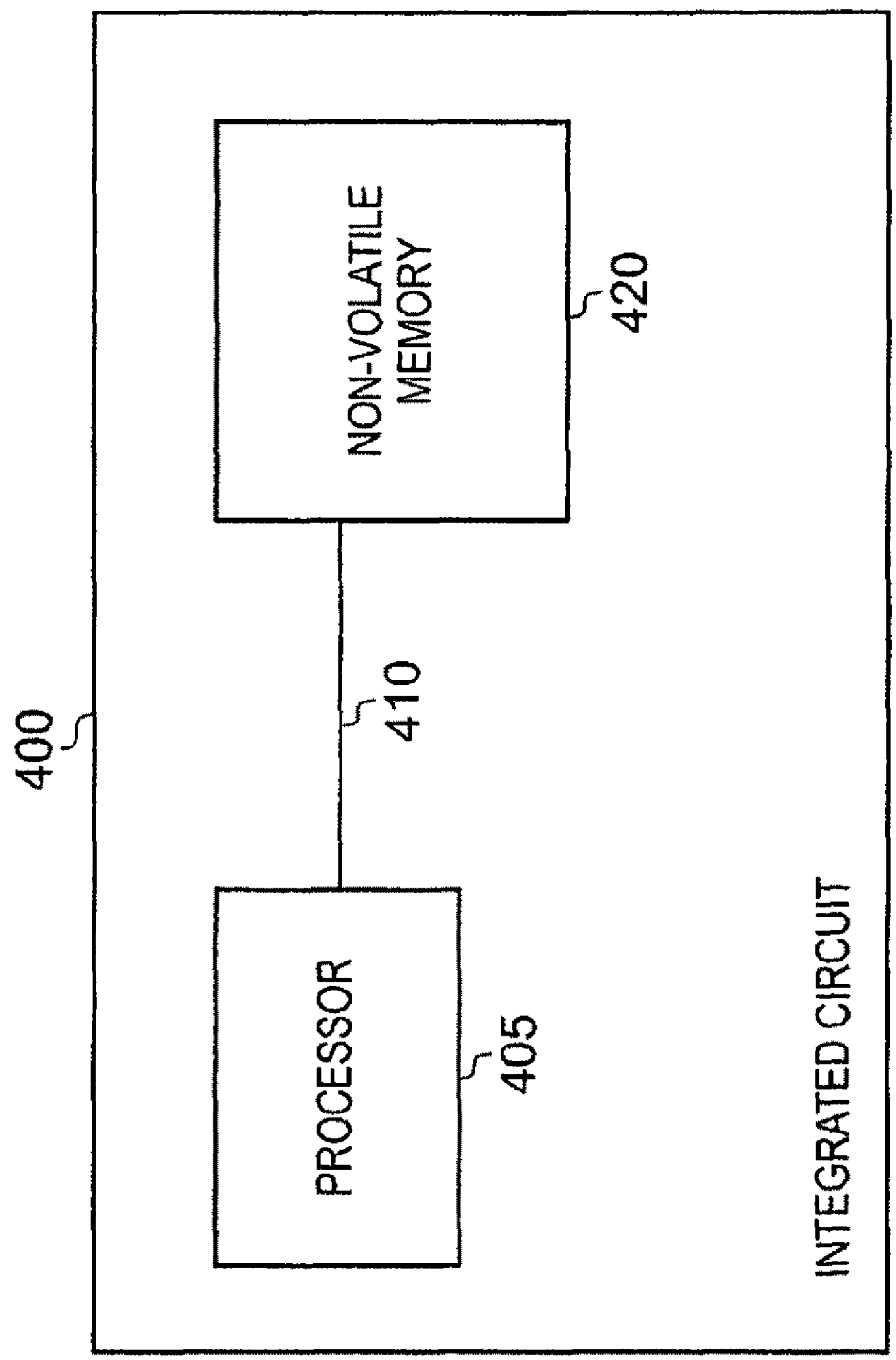
FIG. 10 illustrates an integrated circuit incorporating a non-volatile memory constructed using memory cell structures in accordance with non-limiting, example embodiments.

FIG. 10 schematically illustrates an integrated circuit in which a processing device such as the processor 405 is coupled by a path 410 with a non-volatile memory 420. The non-volatile memory 420 includes a memory array 300 as shown in FIG. 8, such that each of the memory cells is constructed using the memory cell structures of example embodiments. By using such memory cell structures, it is possible to manufacture the entire integrated circuit using standard CMOS logic manufacturing processes, and without the additional mask and process steps that would otherwise be required for conventional non-volatile memories such as EEPROM and Flash memories. Further, by using the memory cell structure of example embodiments, rather than the prior art memory cell structure of FIG. 2, the size of the non-volatile memory 420 can be significantly reduced, thereby giving rise to a smaller integrated circuit. Alternatively, the size of the memory can be retained similar to the size that would be achieved using the prior art memory cell structure of FIG. 2, but the lifetime of the memory device can be significantly increased as a result of the reduced leakage current that occurs when using a coupling capacitor stack. As mentioned earlier, there is typically a trade off between lifetime and capacitor size, and by careful control of the capacitor size and lifetime, it will be possible in some instances to produce a memory cell design which is both smaller, and has a longer lifetime, than the known prior art memory cell.

The techniques of non-limiting, example embodiments can be utilised in a number of integrated circuits, but are particularly advantageous in integrated circuits requiring a moderate amount of non-volatile memory, and which need to be produced simply and cost effectively. Example applications would be for RFID tags, where the low cost of manufacture, and reduced size, are particularly beneficial. Other applications would be System-on-Chip (SoC) circuits requiring a small on-chip non-volatile memory.

Although non-limiting, example embodiments have been described herein, many modifications and additions may be made within the scope of the claims.

We claim:

1. A memory cell structure for a memory device, comprising:
   a substrate;
   a read transistor having a floating gate node;
   a tunnelling capacitor connected to the floating gate node and having a first programming terminal;
   a coupling capacitor stack connected to the floating gate node and having a second programming terminal and having an intermediate node between adjacent coupling capacitors in the coupling capacitor stack, wherein each said intermediate node is isolated from the substrate and is a floating node having a floating voltage during operation of said memory device, the coupling capacitor stack formed of at least two coupling capacitors arranged in series between the floating gate node and the second programming terminal, the coupling capacitor stack having a larger capacitance than the tunnelling capacitor;
   wherein during a programming operation, a voltage difference is established between the first programming terminal and the second programming terminal to cause charge tunnelling to occur through the tunnelling capacitor, such that after the programming operation a charge is stored in the floating gate node; and
   wherein during a read operation, the read transistor is activated to produce an output signal indicative of the charge stored in the floating gate node.

2. A memory cell structure as claimed in claim 1, wherein the read transistor, the tunnelling capacitor, and at least a first coupling capacitor in the coupling capacitor stack are formed on the substrate.

3. A memory cell structure as claimed in claim 1, wherein more than one type of capacitor is used to form the coupling capacitors of the coupling capacitor stack in order to allow physical overlapping of coupling capacitors.

4. A memory cell structure as claimed in claim 1, wherein a first coupling capacitor in the coupling capacitor stack is formed on a substrate, and said intermediate node between the first coupling capacitor and a second coupling capacitor in the coupling capacitor stack is isolated from the substrate.

5. A memory cell structure as claimed in claim 4, wherein the second coupling capacitor is a metal-insulator-metal (MIM) capacitor.

6. A memory cell structure as claimed in claim 5, wherein the first coupling capacitor is a metal oxide semiconductor (MOS) capacitor, the MIM capacitor being formed in one or more layers above the MOS capacitor.

7. A memory cell structure as claimed in claim 6, wherein the MIM capacitor at least partly physically overlies the MOS capacitor.

8. A memory cell structure as claimed in claim 1, wherein each coupling capacitor in the coupling capacitor stack has approximately the same capacitance.

9. A memory device comprising an array of memory cells, each memory cell comprising at least one memory cell structure, and each memory cell structure comprising:
   a read transistor having a floating gate node;
   a tunnelling capacitor connected to the floating gate node and having a first programming terminal;
   a coupling capacitor stack connected to the floating gate node and having a second programming terminal and having an intermediate node between adjacent coupling capacitors in the coupling capacitor stack, wherein each said intermediate node is isolated from the substrate and is a floating node having a floating voltage during operation of said memory device, the coupling capacitor stack formed of at least two coupling capacitors arranged in series between the floating gate node and the second programming terminal, the coupling capacitor stack having a larger capacitance than the tunnelling capacitor;
   wherein during a programming operation, a voltage difference is established between the first programming terminal and the second programming terminal to cause charge tunnelling to occur through the tunnelling capacitor, such that after the programming operation a charge is stored in the floating gate node; and
   wherein during a read operation, the read transistor is activated to produce an output signal indicative of the charge stored in the floating gate node.

10. A memory device as claimed in claim 9, wherein:
    each memory cell comprises a first memory cell structure and a second memory cell structure;
    wherein during the programming operation, the voltage differences established between the first and second programming terminals of the first memory cell structure and the second memory cell structure are such that after the programming operation, a positive charge is stored in the floating gate node of the first memory cell structure and a negative charge is stored in the floating gate node of the second memory cell structure; and wherein during the read operation, the difference between the output signals produced by the read transistors of the first and second memory cell structures indicates a data value stored in the memory cell.

11. An integrated circuit comprising:

processing circuitry for performing data processing operations; and a memory device for storing data for access by the processing circuitry;

the memory device comprising an array of memory cells, each memory cell comprising at least one memory cell structure, and each memory cell structure comprising:

a read transistor having a floating gate node;

a tunnelling capacitor connected to the floating gate node and having a first programming terminal;

a coupling capacitor stack connected to the floating gate node and having a second programming terminal and having an intermediate node between adjacent coupling capacitors in the coupling capacitor stack, wherein each said intermediate node is isolated from the substrate and is a floating node having a floating voltage during operation of said memory device, the coupling capacitor stack formed of at least two coupling capacitors arranged in series between the floating gate node and the second programming terminal, the coupling capacitor stack having a larger capacitance than the tunnelling capacitor;

wherein during a programming operation, a voltage difference is established between the first programming terminal and the second programming terminal to cause charge tunnelling to occur through the tunnelling capacitor, such that after the programming operation a charge is stored in the floating gate node; and wherein during a read operation, the read transistor is activated to produce an output signal indicative of the charge stored in the floating gate node.

* * * * *